(12) United States Patent
Yamauchi et al.

(10) Patent No.: US 7,482,810 B2
(45) Date of Patent: Jan. 27, 2009

(54) SAMPLE TUBE FOR SOLID-STATE NUCLEAR MAGNETIC RESONANCE APPARATUS MAGIC ANGLE HIGH-SPEED ROTATION METHOD AND METHOD FOR MEASURING NUCLEAR MAGNETIC RESONANCE ABSORPTION SPECTRUM EMPLOYING IT

(75) Inventors: Kazuo Yamauchi, Tokyo (JP); Tetsuo Asakura, Tokyo (JP)

(73) Assignee: National University Corporation Tokyo University of Agriculture and Technology, Tokyo (JP)

( * ) Notice: Subject to any disclaimer, the term of this patent is extended or adjusted under 35 U.S.C. 154(b) by 0 days.

(21) Appl. No.: 11/791,543

(22) PCT Filed: Apr. 15, 2005

(86) PCT No.: PCT/JP2005/007303

§ 371 (c)(1),
(2), (4) Date: May 24, 2007

(87) PCT Pub. No.: WO2006/057082

PCT Pub. Date: Jun. 1, 2006

(65) Prior Publication Data

US 2008/0007262 A1    Jan. 10, 2008

(30) Foreign Application Priority Data

Nov. 26, 2004    (JP) .............................. 2004-017603

(51) Int. Cl.
*G01V 3/00*    (2006.01)
(52) U.S. Cl. ...................................... 324/321; 324/318
(58) Field of Classification Search ................. 324/321, 324/322, 318
See application file for complete search history.

(56) References Cited

U.S. PATENT DOCUMENTS 5,302,900 A    4/1994    Cummings
5,469,061 A *  11/1995   Linehan et al. ............. 324/321

(Continued)

FOREIGN PATENT DOCUMENTS

JP    55-101342 U    7/1980

(Continued)

OTHER PUBLICATIONS

International Search Report for International Application No. PCT/JP2005/007303 dated Jul. 26, 2005.

*Primary Examiner*—Louis M Arana
(74) *Attorney, Agent, or Firm*—Millen, White, Zelano, Branigan, P.C.

(57) ABSTRACT

The present invention discloses a sample tube for the magic angle high-speed rotation method used in a solid nuclear magnetic resonance device probe wherein a radio wave irradiation/detection coil is disposed close to a sample and a method of measuring a high resolution nuclear magnetic resonance absorption spectrum using the same. This tube is suitable for solid nuclear magnetic resonance (solid NMR) measurements of minute amounts of sample. The sample tube has a capillary part filled with a sample and non-capillary parts situated at its two ends, and a spinner which can be detachably inserted into at least one of the outer ends of the non-capillary parts. The capillary part and non-capillary parts are made of a ceramic and/or polymer material.

20 Claims, 1 Drawing Sheet

U.S. PATENT DOCUMENTS

| | | | |
|---|---|---|---|
| 5,517,856 A | 5/1996 | Hofmann et al. | |
| 7,075,303 B2 * | 7/2006 | Cavaluzzi et al. | 324/321 |

FOREIGN PATENT DOCUMENTS

| | | |
|---|---|---|
| JP | 101342/1980 | 7/1980 |
| JP | 56-70547 U | 6/1981 |
| JP | 70547/1981 | 6/1981 |
| JP | 58-10134 B2 | 2/1983 |
| JP | 58-10134 Y2 | 2/1983 |
| JP | 58-052552 A | 3/1983 |
| JP | 58-167947 A | 10/1983 |
| JP | 5-249214 A | 9/1993 |
| JP | 05-249214 A | 9/1993 |

* cited by examiner

SAMPLE TUBE FOR SOLID-STATE NUCLEAR MAGNETIC RESONANCE APPARATUS MAGIC ANGLE HIGH-SPEED ROTATION METHOD AND METHOD FOR MEASURING NUCLEAR MAGNETIC RESONANCE ABSORPTION SPECTRUM EMPLOYING IT

FIELD OF THE INVENTION

The present invention relates to a sample tube used for a magic angle high speed rotation process in a solid nuclear magnetic resonance (solid NMR) device, a method of using the same, and in particular to a sample tube having excellent stability which is effective for high resolution solid NMR of a minute amount of material, and to a method of measuring a high resolution solid nuclear magnetic resonance absorption spectrum using the same.

BACKGROUND OF THE INVENTION

A detachable detecting device generally referred to as a probe is installed in the center of the magnetic field of a test section of an NMR apparatus. The probe is a detecting device which measures the magnetic moment of the atomic nucleus of a sample, and it is fitted with a sample tube in which the sample is placed. Radio waves (RF) are generated in the powerful magnetic field, and the emission or absorption of radio wave energy by the sample is measured by a detector. Although the construction of the probe varies according to the type of NMR apparatus, it usually has a space for inserting the test sample tube, fixing members for fixing the probe in the magnetic fields generated by a pair of magnet, RF sending and receiving coils, lead wires to the corresponding RF circuits, shim coils, and an RF preamplifier. The shim coils are placed in the magnetic field away from the probe, and the RF preamplifier may be installed separately from the magnetic field.

NMR systems may be broadly distinguished as solution systems, solid systems, and imaging systems (MRI). Although the principle is the same, the difference lies in the sample installation method, measurement method, and the devices used (spectroscope power, recognition system, and detector (probe), etc.) depending on the differences in the test sample. MRI can be distinguished from other devices because of its familiarity and user type. However, both solution systems and solid systems are used on the research level, therefore, if a person is not trained in the system, he may confuse these systems as if they were identical, but there are large differences between them, for example, it is difficult to use a sample tube across systems.

When performing a solid nuclear magnetic resonance (solid NMR) measurement, high resolution techniques are usually used to obtain a larger amount of information from the sample. This technique differs from technique arranging a sample tube parallel to a static magnetic field as is usually performed in solution NMR, but consists of a method irradiating a radio wave sent from a coil to strike the sample tube, which is inclined at a magic angle of 54.7 degrees relative to the static magnetic field and rotates at high speed in the coil. The property of the material in the sample can be examined by measuring an absorption by a sample or an emission from the sample based on said absorption of the radio wave. This method is called the magic angle rotating process, and is generally used in solid high resolution measurements (e.g., Nonpatent document 1 and 2).

[Nonpatent document 1] Roue, Phys. Rev. Lett. 2, 285, (1959)

[Nonpatent document 2] Andrew, Nature, 183, 1802 (1959)

When using the above-mentioned magic angle rotating process, it is necessary to rotate the sample stably at a high speed of 1,000 revolutions per second or more. In this case, a ceramic or polymer sample tube having a length of about 5 mm to 5 cm, and thickness of several millimeters to about 1 cm, is filled with the sample. This is inserted into the coil arranged in a housing. A gas, such as high-pressure air or nitrogen etc., is sprayed at least at higher part and lower part of the sample tube from the sample tube housing, and the sample tube is floated in the air. The sample tube is rotated at high speed inside the coil by sending high-pressure air into turbine-shaped vanes known as spinners at the end or the center of the sample tube (e.g., Patent document 1 and 2).

[Patent document 1]: JP-A 55-163447

[Patent document 2]: JP-A 58-154645

In order to realize a stable rotation at high speed, flotation bearing air is delivered by two or more (sample tube higher part and lower part) paths, and there is a rotation driving air system separated from the flotation system. To cause it to rotate stably, a housing is provided. Irradiation and detection of radio wave is performed by a solenoid coil surrounding the cylindrical sample tube which is fixed to the housing, and when the probe has been set in the magnetic field, this solenoid is attached so that it is inclined at 54.7 degrees to the static magnetic field. The housing part has at least a flotation air port, a rotation air port, and a terminal for irradiating/detecting radio wave, which can be connected with the outside via the probe body.

In the prior art, when performing the magic angle rotating method for a small amount of sample, (1) the diameter of the sample tube is made small so as to decrease the size of the whole sample tube, or (2) the length of the sample in the sample tube is shortened. However, in the case of (1), it was necessary to re-design the mechanism of the housing of the sample itself in the sample tube, and the sample housing in the observation probe had to be changed over during tests, which was complicated. Further, to perform a stable measurement, the sample must be rotated stably at high speed. However, if the diameter of the sample tube becomes small, the whole sample tube which is struck by the flotation gas also become small. Therefore, there was a defect that the rotation was not stable. In the case of (2), the irradiation of radio wave to the sample was low, and there was a serious defect that the signal detection sensitivity was low. It was therefore desired to develop a sample tube which could stably rotate a small amount of sample, and with which irradiation and detection of radio wave could be efficiently performed.

On the other hand, in the case of a solution, the sample is introduced into a glass test tube (about 15 cm length), fitted to a holder, and then introduced into a solution probe. Next, to cancel out non-uniformities of the sample in the XY direction relative to the magnetic field, the sample is rotated if needed. A rotation of about 20 rotations per second is usually sufficient for this purpose. In general, as for the rotation driving air, the same path for the flotation bearing air is used. Thus, in the case of solution NMR, the magic angle high speed rotation method performed by solid NMR is not used, and there is no housing, either. It is also not required that air strikes the higher part and lower part of the sample tube. This is however indispensable when performing a solid magic angle high speed rotation method. Therefore, in a solution system, the top end of the standard sample tube is made thin, and a micro sample is concentrated (Patent document 3) for measurement.

However, in the magic angle high speed rotation method in solid NMR, stable high speed rotation cannot be performed by simply using a sample tube having a thinner top end.

[Patent document 3]: JP-A 55-101342

SUMMARY OF THE INVENTION

[Problem(S) to be Solved by the Invention]

The Inventor intensively studied sample tubes, which when measuring a small amount of sample using a magic angle high speed rotation method can rotate stably at high speed, and which permit efficient irradiation and detection of radio wave, and a system using the tubes. As a result, the inventor found that while using a sample tube having a sample filling portion as a capillary tube, and forming a non-capillary part at both ends, good results were obtained by arranging the irradiation/detection coil in the vicinity of the capillary part, and thus arrived at the present invention.

It is therefore a first object of the invention to provide a sample tube wherein the radio wave irradiation/detection coil can be disposed in the vicinity of the sample, and which is suitable for solid nuclear magnetic resonance measurement (solid NMR) of a micro samples.

It is a second object of the invention to provide a method of measuring a high resolution nuclear magnetic resonance absorption spectrum of a small amount of solid sample using the magic angle rotating method.

[Means for Solving the Problem]

The aforementioned objects of the present invention were attained by a magic angle high speed rotation sample tube used in a solid nuclear magnetic resonance device probe, characterized in that the sample tube comprises a capillary part for filling a sample, a non-capillary part at both ends of the capillary, and a spinner being inserted in the outside of the non-capillary part of at least one of these ends, and the capillary part and non-capillary parts being made of a ceramic and/or polymer material, and a method of measuring a solid nuclear magnetic resonance spectrum using the sample tube. In the present invention, it is preferred that the capillary part has a uniform thickness. Also if the capillary part and non-capillary part can be split into at least two parts, the capillary part can easily be placed inside the coil, which is therefore preferred. In this case, the capillary part is preferably inserted into the non-capillary part via a member having rubber elastic properties. The outer diameter of the capillary part is preferably ⅓ of the outer diameter of the non-capillary part or less.

[Advantage of the Invention]

The sample tube of the present invention can be stably rotated at a high speed of 1000 revolutions or more per second which is required for the magic angle high speed rotation method, and since sample irradiation/detection with radio wave can be performed efficiently, a high-resolution solid NMR spectrum can be obtained with high sensitivity by using the present sample tube, even in the case of a small amount of sample. Also, the construction comprised of the non-capillary parts struck by flotation air formed at both ends of the capillary part and the spinner part is basically identical to that of conventional sample tube, therefore, it is convenient since conventional probes can be used in the present invention without any modification.

DESCRIPTION OF SYMBOLS

Figure 1:
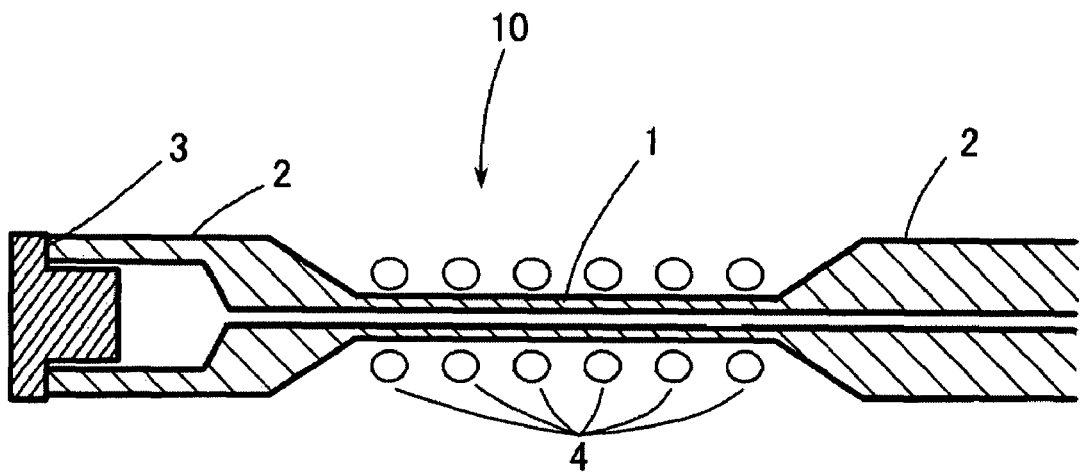
FIG. 1 is a cross-sectional view showing one example of the sample tube of the present invention.
Figure 2:
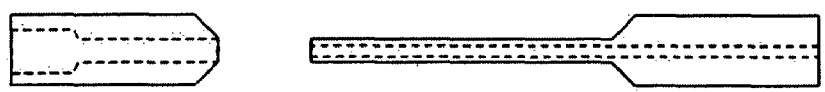
FIG. 2 is a diagram showing one example of the sample tube of the present invention, which can be split into two parts.
Figure 3:
FIG. 3 is a diagram showing a case where the sample tube of the invention is formed from three parts.

1 capillary part
2 non-capillary part
3 spinner
4 solenoid coil
10 sample tube

DESCRIPTION OF THE PREFERRED EMBODIMENTS

The sample tube of the present invention has a capillary part for filling a sample, and non-capillary parts at its two ends. The construction of the non-capillary parts are basically identical to that of conventional sample tube. Specifically, this material is a ceramic or polymer material which can be used at a rotation of 1000 revolutions per second or more in the magic angle rotation method. The ceramic used for the sample tube may be selected from among ceramics known in the art, but zirconia and silicon nitride are particularly preferred. Also, the polymer material used in the sample tube is not particularly limited as long as it can withstand use, but a polyimide and polyethylene fluoride are preferred. Specific examples of these polymers are Vespel from the Dupont Co., Yupimole from the Ube Kosan Co., or Kel-F (kel-f: polychlorotrifluoroethylene) from the 3M Co.

In the present invention, the spinner is detachably fixed to at least one of the outer ends of the two non-capillary parts. The diameter of the capillary part in which the sample is filled is preferably one third or less of the tube diameter of the non-capillary part, but more preferably 1 mm or less. This lower limit is not particularly limited, but from the viewpoint of sample filling and processing precision of the capillary part, it is preferably more than 50 μm, the preferred range being 100-1000 μm. The capillary part is preferably a tube having a uniform thickness. From the viewpoint of enhancing stability when the rotation speed is very high, spinners are preferably provided at the outer ends of the non-capillary parts on both sides of the capillary part.

The radio wave irradiation/detection coil for irradiating the sample with radio wave and obtaining a signal from the sample is an ordinary solenoid coil, and it is preferably disposed in the close vicinity of the capillary part. In general, in solid NMR, the type of glass tube ordinarily seen in solution sample NMR is not placed between the coil and sample tube in order to efficiently detect the signal.

In the present invention, from the viewpoint of obtaining high sensitivity, the inner diameter of the coil is preferably less than the outer diameter of the non-capillary part of the sample tube. Therefore, the sample tube is preferably split between the capillary part and non-capillary part so that the capillary part of the sample tube can be easily inserted in the coil. Also, the two non-capillary parts, which are struck by flotation air preferably, have a uniform thickness of 1 mm to 1 cm, which is as thick as conventional sample tubes.

The length of the sample tube is not particularly limited, and may be basically identical to that of conventional sample tubes. Normally, sample tubes having a length of 5 mm-5 cm used for solid NMR may preferably be used here. The length proportion of the capillary part and non-capillary parts is also not particularly limited, but the length of the non-capillary parts into which the sample is filled is 100 μm-1 cm. The length of the non-capillary parts is 1/50-1/3 of the length of the capillary part, but they are preferably about 1/3 of the length of the capillary part, and the sample tube preferably has upper-lower/left-right symmetry. The turbine part of the spinner is larger than the outer diameter of the non-capillary parts so as to obtain stable rotation. The material of the spinner is normally plastic.

Hereafter, a sample tube of the present invention will be described based on a specific example. FIG. 1 shows a representative example of the sample tube of the present invention. The symbol 10 in the diagram is the sample tube, 1 is the middle capillary part, 2 is a non-capillary part having normal thickness, 3 is a spinner with vanes, and 4 is a solenoid coil which is a typical example of a radio wave irradiation/detection coil. In this example, there is a tapered part between the capillary part 1 and non-capillary parts 2, but it need not be tapered and may be for example a vertical plane.

The capillary part 1 and non-capillary parts 2 may be formed in one piece as shown in FIG. 1, but at least one of the non-capillary parts is preferably formed so that it can be detached from the capillary part 1. This arrangement has the advantage that the capillary part can easily be inserted in the solenoid coil 4, which has a smaller inner diameter than the non-capillary parts 2. In this case, after inserting the capillary part in the solenoid coil, the non-capillary parts are joined to the capillary part to form the sample tube. When the capillary part and non-capillary parts are formed in a one-piece construction, the solenoid coil is first disposed in the vicinity of the capillary part, the whole is placed in the probe and the end of the solenoid coil is joined to a terminal in the probe.

When the non-capillary parts 2 and capillary part 1 are formed so that they can be detached from one another, the method of joining the non-capillary parts to the capillary part may be any desired method. For example, the two parts may be screwed into each other, or a hole may for example be formed in the center of the non-capillary parts 2 so that the capillary part 1 can be inserted, wherein a joining means such as a rubber elastic member like an O-ring may be provided in the hole. Alternatively, the non-capillary parts 2 at both ends and the capillary part 1 may be manufactured separately, and the two parts may be formed in one-piece using for example at least two of the aforesaid joining members.

When the non-capillary parts 2 at both ends and the capillary part 1 are manufactured separately, if for example a capillary filled with the sample is used, the capillary part can be disposable, which is not only economical but also easy to use. The capillary part may also be a sealed tube, which is sealed at both ends, this being particularly convenient for the measurement of samples which might be affected by oxygen. In the present invention, in this case also, not only the capillary part but also the joining members used to form a one-piece construction, the non-capillary parts and the spinner are combined together to make a whole sample tube actually used for measurement which is included in the definition of the sample tube of the invention.

The spinner is placed by inserting, for example a conventional plastic spinner in at least one end of each non-capillary part 2. It will of course be understood that the spinner may be respectively disposed in each of the two non-capillary parts. The setting of the sample tube to the solid NMR device may be basically identical to that of the conventional sample tube. Specifically, there is an opening which is one end of the solenoid coil in the housing placed at the magic angle, the sample tube being either inserted directly into this opening, or the sample tube being placed in the solenoid coil in the housing using a conducting guide.

The sample tube is rotated by passing in rotation driving air or nitrogen gas, which is passed separately from the flotation system, so as to rotate the spinner by a known method. Also, by passing in the flotation gas between the non-capillary parts of the sample tube and the housing, the sample tube can be floated while at the same time it is rotated at 1000 revolutions per second or more. Depending on the measurement target and method employed, there may be an upper limit and lower limit to the rotation speed, but normally the sample tube is rotated as rapidly as possible.

The flotation gas strikes the upper and lower non-capillary parts of the sample tube, which then floats inside the housing. When the rotation gas strikes the turbine part at the end, the sample tube rotates. By controlling the air pressure by means of a pressure regulating instrument with which the system is provided, a stable, high-speed rotation is realized.

In order to efficiently obtain an NMR signal from a minute sample, the sample must be irradiated by radio wave as uniform as possible, to obtain a signal from the sample. Hence, the radio wave irradiation/detection coil must be disposed very close to the sample (See, non-patent document 3.), and in the case of the sample tube of the invention, a coil similar to the solenoid coil is disposed in the vicinity of the capillary part filled with sample. Therefore, in the present invention, the solenoid coil and sample tube are normally disposed very close to each other at a distance of 5 mm or less. However, in the magic angle rotation method, if they come into contact, friction is produced which interferes with the rotation, so normally the two are disposed at a distance of 50 μm or more.

Nonpatent document 3: Yamauchi et al, J. Magn. Reson., 167, 87 (2004)

The method of efficiently irradiating the sample with radio wave and obtaining an NMR signal has been considered by Hault and Richard, who proposed the following equation for calculating the signal strength and noise intensity which was theoretically obtained (See, non-patent document 4.).

Equation 1

$$\frac{S}{N} = \frac{\left(\frac{B_1}{i}\right)V_S N\gamma \hbar^2 I(I+1)\frac{\omega_0^2}{k_B T 3\sqrt{2}}}{F\sqrt{4k_B T R_{noise}\Delta f}} \quad (1)$$

Here, $B_1/i$ is the magnetic field generated per unit electric current, $V_s$ is the sample amount, N is the spin number per unit sample amount, γ is the nuclear magnetic rotation ratio, I is the spin number, $\omega_0$ is the Larmor frequency, T is the temperature, and h, $k_B$ are respectively the Plank constant and the Boltzmann constant.

Nonpatent document 4: J. Magn. Reson. 24 71(1976)

Noise components are represented by a noise factor (F), coil resistance value (Rnoise), and measurement width (Δf). Among these, $B_1/i$ may be expressed as follows according to Biot-Savart Law:

Equation 2

$$\frac{B_1}{i} = \mu_0 n \left( \frac{\frac{x}{l}+\frac{1}{2}}{\sqrt{4r^2+(2x+l)^2}} - \frac{\frac{x}{l}-\frac{1}{2}}{\sqrt{4r^2+(2x+l)^2}} \right) \quad (2)$$

Here, x is the distance from the coil center, $\mu_0$ is the magnetic permeability in a vacuum, n is the number of coil windings, and r, l are respectively the coil diameter and length. When the sample amount is limited, the coil is made small, and in the case of a solenoid coil, the sensitivity increases by increasing the number of coil windings.

The use of a solenoid coil in the present invention is effective to increase the uniformity of the magnetic field $B_1$ which is generated using the aforesaid method as is often performed with solid NMR. For example, in the probe of the example of the present invention, the signal intensity per a single nucleus is increased compared to that of conventional probes, and the efficiency is high. Thus, by making the coil small and placing the sample very close to it (solenoid coil 4 in FIG. 1) is very effective in obtaining a high resolution nuclear magnetic resonance spectrum.

If the turbine part (outer ends of the non-capillary parts) which produces the rotation is of the order of several millimeters, the spin error of the sample itself can be of the order of several Hertz.

INDUSTRIAL USE OF THE INVENTION

If the sample tube of the present invention is used in a solid NMR device, even if the sample amount to be measured using the magic angle high-speed rotation method is very small, the sample can be rotated stably at high speed, and radio wave irradiation/detection can be efficiently performed, so a high resolution solid NMR spectrum can be obtained with high sensitivity. Also, the measurement sample is not limited to solids, and may be applied also to minute sample amounts such as gels, liquid crystals and solutions which require a stable magic angle high-speed rotation method in a system requiring radio wave irradiation and rotation.

What is claimed is:

1. A sample tube for use with the magic angle high-speed rotation method, used in a solid nuclear magnetic resonance device probe, said sample tube comprising:
   (1) a capillary part having two ends for holding a sample,
   (2) a pair of non-capillary parts, one of said non-capillary parts being situated at one end of the capillary part and the other of said non-capillary parts being situated at the other end of said capillary part,
   (3) at least one of said non-capillary parts being removably attached onto one of said ends of said capillary part,
   (4) said capillary part and non-capillary parts both being made of a ceramic or polymeric material,
   (5) a detachable spinner inserted into one of said capillary parts, and
   (6) said capillary part having an outer diameter which is smaller than the outer diameter of said non-capillary parts.

2. The sample tube according to claim 1, wherein said capillary part has a uniform thickness.

3. The sample tube according to claim 1, wherein the at least one non-capillary parts which is removably attached onto one of said ends of said capillary part can be joined to said capillary part via a member having rubber elasticity.

4. The sample tube according to claim 1, wherein said sample tube has two detachable spinners, one of said detachable spinners is inserted into one of said capillary parts, and the other of said detachable spinners is inserted into the other of said capillary parts.

5. The sample tube according to claim 1, wherein the outer diameter of said capillary part is ⅓ of the outer diameter of the non-capillary parts, or less.

6. A sample tube according to claim 5, wherein the outer diameter of said capillary part is less than ⅓ of the outer diameter of the non-capillary parts.

7. A method of measuring a nuclear magnetic resonance spectrum comprising measuring the absorption of radio wave due to a sample and/or a radiation from a sample based thereupon, wherein said sample is inclined at 54.7 degrees to a stationary magnetic field, rotated at high speed in a coil, and radio wave are emitted from said coil to the sample and wherein said sample tube is a sample tube according to claim 1.

8. A sample tube according to claim 1, wherein the diameter of the capillary part is 1 mm or less.

9. A sample tube according to claim 1, wherein the diameter of the capillary part is 100-1000 μm.

10. A sample tube according to claim 1, wherein the thickness of the non-capillary parts is 1 mm to 1 cm.

11. A sample tube according to claim 1, wherein the length of the sample tube is 5 mm-5 cm, and the length of the non-capillary parts is ⅟₅₀-⅓ of the capillary part.

12. A sample tube according to claim 1, wherein the spinner has a turbine part which has a larger diameter than the outer diameter of the non-capillary part.

13. A sample tube according to claim 1, wherein the at least one non-capillary parts which is removably attached onto one of said ends of said capillary part can be joined to said capillary part by screwing said capillary part into the at least one detachable non-capillary parts.

14. A sample tube according to claim 1, wherein the at least one non-capillary parts which is removably attached onto one of said ends of said capillary part can be joined to said capillary part by inserting said capillary part into a hole formed in the center of the at least one detachable non-capillary parts.

15. A sample tube according to claim 1, wherein said capillary part is inserted into said at least one of the non-capillary parts via a member having rubber elastic properties.

16. A sample tube according to claim 1, wherein the non-capillary parts and the capillary part are made of ceramic material.

17. A sample tube according to claim 16, wherein the spinner is made of plastic material.

18. A sample tube according to claim 1, wherein the non-capillary parts and the capillary part are made of polymeric material.

19. A sample tube according to claim 18, wherein the spinner is made of plastic material.

20. A sample tube according to claim 1, wherein the spinner is made of plastic material.

* * * * *